(12) United States Patent
Wolak et al.

(10) Patent No.: US 6,792,008 B2
(45) Date of Patent: Sep. 14, 2004

(54) TRACKING ERROR SUPPRESSION AND METHOD OF REDUCING TRACKING ERROR

(75) Inventors: Edmund L. Wolak, Palo Alto, CA (US); Tae J. Kim, San Jose, CA (US); Harrison Ransom, Antioch, CA (US); Jo Major, San Jose, CA (US); Robert Lang, Pleasanton, CA (US)

(73) Assignee: JDS Uniphase Corporation, San Jose, CA (US)

( * ) Notice: Subject to any disclaimer, the term of this patent is extended or adjusted under 35 U.S.C. 154(b) by 80 days.

(21) Appl. No.: 09/915,184

(22) Filed: Jul. 24, 2001

(65) Prior Publication Data

US 2002/0159488 A1 Oct. 31, 2002

Related U.S. Application Data

(60) Provisional application No. 60/287,936, filed on Apr. 30, 2001, and provisional application No. 60/291,949, filed on May 21, 2001.

(51) Int. Cl.$^7$ .......................... H01S 3/067; H01S 3/13; G02B 6/32
(52) U.S. Cl. ................... 372/6; 372/32; 385/33
(58) Field of Search .......................... 372/6, 32; 385/33

(56) References Cited

U.S. PATENT DOCUMENTS

| | | | |
|---|---|---|---|
| 4,292,512 A | 9/1981 | Miller et al. | 250/205 |
| 4,803,361 A | 2/1989 | Aiki et al. | 250/227.24 |
| 5,074,682 A | 12/1991 | Uno et al. | 385/93 |
| 5,455,879 A | 10/1995 | Modavis et al. | 385/33 |
| 5,485,481 A | 1/1996 | Ventrudo et al. | 372/6 |
| 5,500,911 A | 3/1996 | Roff | 385/33 |
| 5,706,302 A | * 1/1998 | Shimizu | 372/36 |
| 5,870,417 A | * 2/1999 | Verdiell et al. | 372/32 |
| 5,940,557 A | 8/1999 | Harker | 385/33 |
| 6,400,736 B1 | * 6/2002 | Aherne et al. | 372/6 |
| 6,488,414 B1 | * 12/2002 | Dawes et al. | 385/79 |
| 2002/0106156 A1 | * 8/2002 | Vail et al. | 385/37 |
| 2002/0159693 A1 | * 10/2002 | Wolak et al. | 385/33 |

FOREIGN PATENT DOCUMENTS

| | | |
|---|---|---|
| EP | 0 465 230 A | 1/1992 |
| EP | 1 160 600 A | 12/2001 |

\* cited by examiner

*Primary Examiner*—Don Wong
*Assistant Examiner*—James Menefee

(57) ABSTRACT

A laser package comprises a laser diode source having a first Fabry-Perot cavity between a highly reflective back facet and low reflective front facet for providing a first light output for an optical application. A light monitor is positioned adjacent to the back facet and aligned to receive a second light output from the laser diode back facet. A pigtail fiber having a lensed fiber input end is positioned from the laser diode front facet to form an optical coupling region and is aligned relative to the lasing cavity to receive the first light output into the fiber, the light output exiting the package for coupling to the application. A portion of the first light output from the lasing cavity is reflected off the lensed fiber input end with a portion directed back into the lasing cavity and another portion reflected off of the laser diode front facet. The front facet forms with the lensed fiber input end a second Fabry-Perot cavity generating light which is periodically in and out of phase with the light generated in the first Fabry-Perot cavity due to changes in the length of the second Fabry-Perot cavity caused by package ambient temperature changes so that a tracking error is generated in a signal developed by the light monitor. Thus, this invention provides several ways to suppress the formation of the second Fabry-Perot cavity.

18 Claims, 12 Drawing Sheets

TRACKING ERROR SUPPRESSION AND METHOD OF REDUCING TRACKING ERROR

CROSS REFERENCE TO RELATED APPLICATIONS

This invention claims priority from U.S. Provisional Patent Application, Ser. No. 60/287,936 entitled TRACKING ERROR SUPPRESSION AND METHOD OF REDUCING TRACKING ERROR by Edmund Wolak, Tae Jin Kim, and Hanision Ransom, filed Apr. 30, 2001; and from U.S. Provisional Patent Application, Ser. No. 60/29 1,949 entitled ADVANCED LENS SHAPES FOR FIBER COUPLED LASERS WITH REDUCED FEEDBACK by Edmund L. Wolak, Lei Xu, and Robert Lang, filed May 21, 2001; the disclosures of which are hereby incorporated in their entirety for all purposes. This application is being concurrently filed with U.S. patent application Ser. No. 09/915,186, entitled LENSED OPTICAL FIBER by Edmund L. Wolak, Li Xu, Robert Lang and Tae J. Kim the disclosure of which is hereby incorporated for all purposes.

FIELD OF THE INVENTION

This invention relates generally to monitoring of light sources and more particularly to the suppression of tracking error in the monitoring of the output intensity of laser source, such as in the case of a laser pump module. However, this invention is equally applicable to any other applications where tracking of the intensity or power output of a laser source is required, albeit a semiconductor laser, a fiber laser or a solid-state laser.

BACKGROUND OF THE INVENTION

In the employment of pump laser modules, such as 980 nm and 1480 nm pump modules, for optical telecommunication applications, it is necessary to insure that the output intensity of the pump laser is maintained at a desired level. This is currently done by monitoring the output power that is provided out of the pump module pigtail fiber using a monitor device, such as a monitor photo diode (MPD), positioned at the back facet of the laser diode chip in the module package. The pump module typically comprises a laser diode chip with its front facet light output provided from the laser cavity aligned to be optically coupled into a single mode pigtail fiber which fiber terminates externally of the package for splicing to a fiber amplifier or fiber laser or other type of optical application. The optical coupling of the laser diode output has been accomplished by means of a lens that collimates and focuses the output light into the input end of the fiber. Some of the laser diode output light is reflected back from the lens back into the laser cavity, where it is amplified in the laser cavity and exits, in part, out of the back facet to the MPD. Another portion of the output light is scattered and lost within the module case or package. Light reflecting from the lens or other optical element may be detected directly without the light passing thorough the diode waveguide.

A more attractive approach for coupling this light is the use of a pigtail fiber that has a lens formed on its input end such as chisel or wedged shaped lens, as disclosed in U.S. Pat. No. 5,940,557 by Harker; U.S. Pat. No. 5,455,879 by Modavis et al.; U.S. Pat. No. 5,500,911 by Roff, and U.S. Pat. No. 5,074,682 by Uno et al.; all of which are incorporated herein by their reference. In particular, if the chisel shaped input end of the pigtail fiber is angled relative to the longitudinal axis of the fiber, further improvements in coupling efficiency can be realized as set forth in U.S. Pat. No. 5,940,557. The angled lens with an anti-reflecting (AR) coating placed on its surface prevents a significant portion of laser diode output light reflected off the input chisel lens from reentering the laser diode chip.

As is well known in the art of laser diodes, the back facet of the pump module laser diode has a high reflecting (HR) coating while the front facet has a low reflecting or anti-reflecting (AR) coating so that most of the laser diode optical power in the laser cavity will emanate from the front facet while being highly reflected at the back facet. However, a HR reflector is not a perfect reflector so that approximately 0.5% to 10% of the laser light will penetrate the HR coating and can be employed with the MPD to track the output power of the laser diode by sensing the back facet light from the laser diode. Another way of checking and monitoring the output power is split off a small portion of the output power, e.g. 0.5% or 1% and feed this small amount to an MPD. Typically, the monitor current is going to be about 0.5 to 1 milliamp of current per milliwatt of power from the laser diode chip back facet impinging on the MPD. It has been traditionally preferred to place the MPD at the back facet of the laser diode to take advantage of the small amount power emanating from the back facet of the diode.

One problem with the MPD detector in the package is that with changes in the ambient temperature within the module package for a given output power from the module, the MPD changes in value with such temperature changes. In use of the pump module, end users desire that, for a given MPD current output, a given optical output power can be derived from the module. However, there is always some variation to be expected with changes in the case temperature, but it is required to be within tolerable limits or range, which is now considered between about ±5–10% with a package temperature variation from about 0–75° C. In other words, a tracking error of MPD with ±8% is presently acceptable but values beyond this range are not generally acceptable to end users. Also, the maximum acceptable tracking error will likely be required to be reduced as end user's demands for higher accuracy continually increase, imposing further suppression of tracking error by pump module manufacturers. Tracking error herein is defined as the change in module output power with the change in case or package temperature for a fixed MPD current developed from the light output collected from the laser diode back facet by the MPD. We have experienced back facet MPD tracking errors in excess of this range and, therefore, something needs to be done to provide for more accurate tracking of the output power of the module to meet the need of end users.

There are several complicated factors in determining the cause of tracking error but two of the principal causes are described as follows. As the module case temperature changes with operation or with ambient temperature, the inside ambient of the pump module package, where the laser diode chip and MPD are positioned, is set to be at a predetermined operating temperature using a thermo-electric cooler ("TEC"), which may be any number of different operating temperatures but is typically 25° C. This is done so that the operating temperature remains the same so the optical characteristics of module operation do not significantly change with ambient temperature.

However, as the module package temperature changes during operation, the package, and particularly the platform supporting the laser diode and the coupling pigtail fiber input end, will flex or warp ever so slightly causing slight internal misalignment between the lensed fiber input tip or end and the laser front facet. This distance or cavity length between the fiber lens and the laser diode front facet is typically around 10 μm. Compared to the cavity length of the laser diode chip, this is quite small. The typical cavity length of a 980 nm chip is about 1.5 mm and the cavity length of a 1480 chip is about 2 mm.

The relative reflective feedback off the lensed fiber tip and the reflected light off of the external surface of the laser front facet form a Fabry-Perot (F-P) cavity. Thus, there are two such F-P cavities existing in the package—the laser Fabry-Perot (F-P) primary cavity and the facet-to-lens Fabry-Perot (F-P) secondary cavity wherein reflected light from these component surfaces in the secondary cavity achieves some degree of resonance. As the case temperature changes, the distance between the laser front facet and the fiber lens tip can change by a small amount.

Changes in the length of the secondary F-P cavity arising from changes in the case temperature causes the light in this secondary cavity to go into and out of phase with the phase of the light generated in the laser diode chip, adding to and subtracting from the light emitted from the laser diode. This change in phase does not have much effect on the pump module output power because the light reflected between the front facet of the laser diode and the face of the lensed fiber is relatively small compared to the total light output from the laser diode. However, these changes in phase interference can have a significant effect on the MPD because the feedback going into the laser diode from the secondary F-P cavity is amplified in the laser diode chip and the amplified output is detected by the MPD. Thus, the MPD detects a value that is not truly representative of the output intensity of the laser diode and the value detected by the MPD changes with the phase interference between the primary and secondary cavities even though the output power from the module changes very little, if at all.

Another effect on MPD tracking error is fiber lay or positioning in the package, which, due to changes in the birefringence, can change the effective grating strength in the fiber Bragg grating in the pigtail fiber. Changes in case temperature can cause changes in stress on the fiber, particularly in the module snout. Changes in such stress cause changes in the fiber birefringence, which in turn can cause varied amounts of circular polarization. Light reflected off the fiber grating and fed back into the chip will only amplify in one polarization of the light. Thus, changes in stress in the snout with temperature can cause changes in MPD current.

In view of the foregoing, tracking error can be caused by the flexing of the package platform supporting the laser diode chip and the input end of the pigtail fiber, as well as feedback light entering into the laser diode cavity where it is amplified and detected by the MPD in addition to other light emitted from the laser cavity emitted from the back facet.

OBJECTS OF THE INVENTION

Therefore, it is an object of the present invention to overcome the aforementioned problems.

It is a further object to suppress or otherwise reduce tracking error in pump module output power monitoring to acceptable levels.

SUMMARY OF THE INVENTION

According to this invention, several solutions are provided for suppressing monitoring tracking error.

One solution for reducing tracking error is to employ a biconic lens, instead of a chisel lens, on the input fiber tip in order to suppress the interference caused by the light reflection feedback from the lens on the fiber tip. Additionally, the results are further improved with the biconic lens being angled a few degrees on the input fiber tip relative to the longitudinal axis of the fiber. The angled biconic lens is then spatially positioned from the laser diode output emission with the axis of the laser cavity and, in addition, may be also angularly disposed relative to the longitudinal axis of the pigtail fiber. This has been shown to reduce the change in MPD output current with fixed laser diode power output. The biconic lens has a continuous curved surface whereas the use of a chisel lens has some locally flat surfaces providing stronger feedback reflection. With the use of a biconic lensed fiber input end, there is less feedback of reflected light back into the laser diode cavity. Also, an AR coating may be added to the lens surface to reduce its reflection.

Another solution is to employ a biconic lens whose center is offset from the center of the fiber core by a few microns rather then employing an angularly disposed biconic lens on the fiber. In the case here, the center of the biconic lens radius in the plane of the laser diode junction is laterally offset from the center axis of the fiber input end. As a result, light reflected off of the end of the offset biconic lens would tend to be reflected at an angle to the axis of the laser cavity and, therefore, not fed back into the laser diode cavity. Such offset reflected light would avoid establishing the F-P secondary cavity that leads to tracking error.

Another solution is employing a chisel lens so that a substantial portion of the reflected light from the chisel lens would not reflect back into the laser diode cavity, especially with the additional compound angle placing the axis of laser diode chip at an angle with respect to the axis of the fiber. Angling a chisel lens with respect to the axis of the optical fiber can reduce tracking error at the monitor, e.g. the MPD by avoiding the formation of a strong secondary F-P cavity between the front facet of the laser diode and the chisel lens.

A further solution for reducing tracking error is to strengthen the relatively low coefficient of thermal expansion platform supporting the laser diode source and the coupling fiber supported on the TEC in the package. Preferred materials for such submounts are those with high thermal conductivity. Such materials include ceramics and AlN. By rendering the platform thicker without exceeding the physical limits of the package, the tendency for flexing movement between the laser diode front facet and the lensed input tip or end of the pigtail fiber will be substantially mitigated. This solution in combination with any of the other solutions described and disclosed herein provides for an enhanced suppression of monitor tracking error.

Another solution for reducing this tracking error is to move the MPD to another location in the package rather than at a position at the back facet of the laser diode chip. One such location is adjacent to the coupling region between the laser diode front facet and the lensed input fiber tip where it can detect light lost from the light output from the laser diode front facet. About 30% of the laser light output is typically lost internally in the package due to light divergence and scattering. By detecting light from the front region of the laser diode chip, the laser chip no longer functions as an amplifier of backward reflected light into the laser cavity which magnifies the effects of small changes in the effective front facet reflectivity or changes in the F-P secondary cavity reflectivity. In one embodiment the MPD is to the side of the coupling region and in another embodiment the MPD is beneath the coupling region. Another location is to the side where the MPD monitors reflections off the lensed fiber end.

A still further solution is to increase the reflectivity strength of a fiber Bragg grating formed in the pigtail fiber for feedback of a portion of the light for wavelength stabilization of the laser diode. If the fiber Bragg grating reflectivity level is significantly greater than the reflectivity level of the front facet experienced by the laser diode, small changes in the effective front facet reflectivity or changes in the secondary cavity will have a diminished effect on the changes in the light level emitted from the back facet of the laser diode. Typically the grating reflectivity level may be anywhere between 0.3% to 3% of the transmitted light in the fiber and, further, may be less than the reflectivity of the laser diode front facet. By increasing its reflectivity level, for example to 6%, changes in package temperature affecting the secondary cavity length or effects in the amount of reflectivity from the lens fiber tip or front facet back into the laser cavity become insignificant due to the comparatively high amount of feedback light from the grating to stabilize the laser diode operation. The use of two or more gratings can reduce the effects arising from birefringence changes in the snout.

Another solution is to coat the end of the fiber lens so as to be more reflective than the reflectivity level of the output front facet or to coat the diode facet so that its reflectivity at the peak wavelength, such as 980 nm, is significantly higher than that off of the surface of the fiber tipped lens, in either case suppressing the establishment of the a F-P secondary cavity. This is because F-P cavities exhibit stronger characteristics if the opposed reflecting surfaces establishing the cavity have similar reflective levels.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings, like reference symbols refer to like parts.

DETAILED DESCRIPTION OF THE INVENTION

Figure 1A:
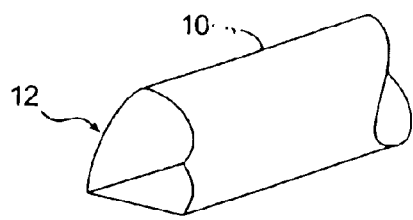
FIG. 1A is a perspective view of a biconic lensed fiber end or tip in accordance with one aspect of this invention.
Figure 1B:
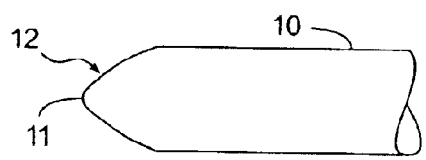
FIG. 1B is a side view of the biconic lensed fiber end shown in FIG. 1A.
Figure 1C:
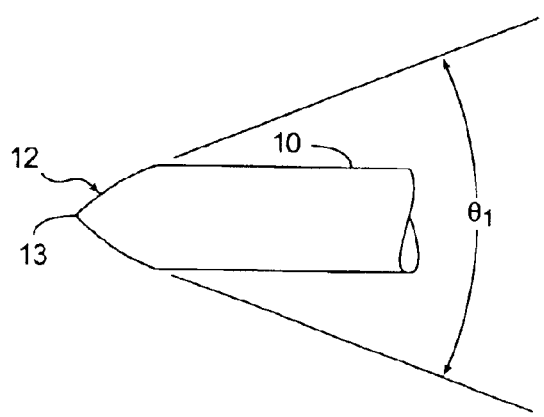
FIG. 1C is a plan view of the biconic lensed fiber end shown in FIG. 1A.

Reference is now made to FIG. 1A wherein there is shown a tensed fiber end 10 or tip comprising a biconic lens 12. The lens is formed on the fiber using special processing steps to form the curvatures of the lens surfaces and has a shape similar to a weather pyramid. The biconic lens 12 has curvatures that are different in orthogonal directions as depicted in FIGS. 1B and 1C. In one orthogonal direction, as shown in FIG. 1B, a first radius of curvature 11 is 14 $\mu$m whereas in the other orthogonal direction a second radius of curvature 13 is 8 $\mu$m, with a tapered angle $\theta_1$ of about 50° to 55°. Such a lens is also shown in concurrently-filed co-pending U.S. patent application Ser. No. 09/915,186, entitled LENSED OPTICAL FIBER by Edmund L. Wolak, Lei Xu, Robert Lang. and Tae 3. Kim which is assigned to the assignee herein and is incorporated herein by its reference. The larger radius in the plane of the lens may be, for example, around 12–22 $\mu$m while in the side elevation orthogonal to this plane the radius of curvature may be, for example, around 5–10 $\mu$m. As set forth in application Ser. No. 09/915,186, the biconic lens provides for improved coupling efficiency compared to a chisel or wedged-shaped fiber lens. The use of a biconic lens 12 has shown to reduce the change in the laser diode monitor output of laser monitor 15 (FIG. 2A), for example, a monitor photo diode (MPD), due to a difference in the level of reflected light feedback employing a biconic lens over a chisel or wedged-shaped lens. Monitor photo diodes can be avalanche diodes and PiN photodiodes, among others. The biconic lens has a continuous curved surface whereas the use of a chisel lens has some locally nearly flat surfaces that can provide some feedback reflection. With the use of a biconic leased fiber input end, there is less feedback of reflected light back into the laser diode cavity. Also, an AR coating is preferably applied to the biconic lens surface to reduce its reflection capabilities in the range of wavelengths produced in the laser diode output.

Figure 2A:
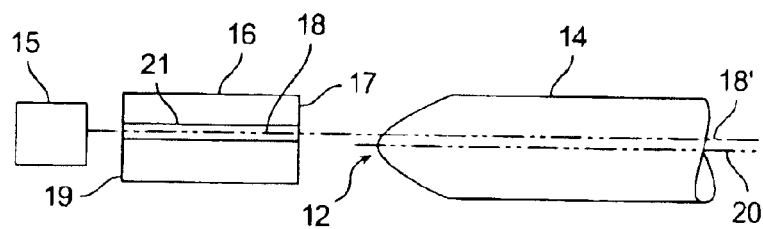
FIG. 2A is a plan view of a lensed fiber end in conjunction with a laser diode where the center axis of the lens is fractionally offset from the center axis of the optical fiber.

As shown in FIG. 2A, the biconic fiber lensed input end 10 of pigtail fiber 14 is positioned in front of the laser diode 16 to receive the light output from the diode via front facet 17. Laser diode 16 also includes a back facet 19, which has a highly reflective (HR) coating on it surface to reflect around 93–98% of the laser cavity light back into the laser cavity 21. However, 2% to 7% of the light penetrates through the back facet 19 and is received by laser monitor 15 to produce a current signal indicative of the laser diode output power or intensity.

In the case of the embodiment of FIG. 2A, the center of curvature of the biconic lens lies along a line 20 that is offset from the center axis 18' of the fiber, which in this embodiment is aligned with the cavity axis 18 of laser diode 16. In other embodiments the center axis of the fiber is angled a few degrees from the cavity axis of the laser diode. In this way, a majority of the light output from the front facet 17 is captured and collected by biconic lens 12 but any reflected light off of the surface of lens 12 and propagating back into the laser cavity 21 of laser diode 16 is minimized. The amount of offset is dependent on the distance between the laser diode front facet 17 and the shape of biconic lens 12 as well as the size of the single mode core of fiber 14, but it may be in the range, for example, of several microns. As previously mentioned, an AR coating is preferably applied to the surface of biconic lens 12 in some embodiments to reduce its reflection capabilities.

Figure 2B:
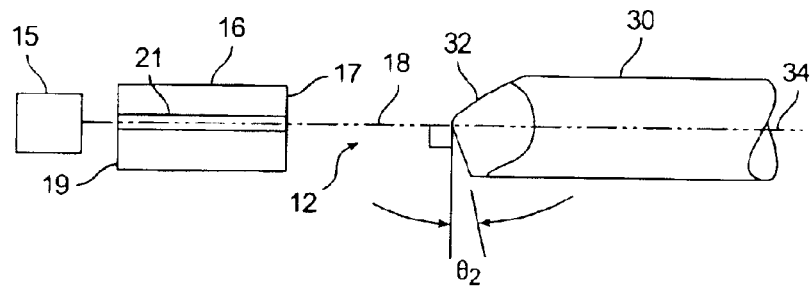
FIG. 2B is a plan view of an angled chisel-shaped lensed fiber end of the type disclosed in U.S. Pat. No. 5,940,577.

Reference is now made to FIG. 2B, which illustrates an angled chisel type lens 32, such as is discussed in U.S. Pat. No. 5,940,557, incorporated herein, on a fiber end 30. As shown in FIG. 2B, the axis of lens 32 is angled with respect to the normal of the center axis 34 of fiber end 30. In the example here, the angle $\Theta_2$ from the normal to the fiber longitudinal or optical axis 34 may be around 8°, which is exaggerated in FIG. 2B for purposes of illustration. The chisel lensed fiber input end 30 is shown in FIG. 2B with its central axis 34 aligned with the axis 18 of laser cavity 21. However, as shown in U.S. Pat. No. 5,940,557, the axis 18 of laser diode 16 may be aligned at an angle relative to the axis 34 of the fiber end 30. As previously mentioned, an AR coating is preferably applied to the surface of chisel lens 32 to reduce its reflection capabilities.

The angled chisel lens 32 is used in combination with the laser diode 16 and laser monitor 15 to reduce tracking error. In particular, the angled chisel lens reduces the light from the aperture 18 of the front facet 17 reflected back into the laser cavity 21 that would be amplified and transmitted through the back facet 19 of the laser diode to the laser monitor 15. This amplified back reflected light can cause tracking error in the system because the light detected by the laser monitor does not accurately indicate the light output of the laser diode.

Figure 2C:
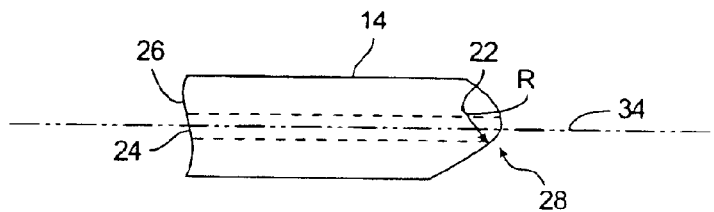
FIG. 2C is a simplified top view of a lensed optical fiber according to an embodiment of the present invention illustrating an offset center of the radius of the lens.

FIG. 2C is a simplified top view of an optical fiber 14 according to an embodiment of the present invention illustrating a center 22 of the radius R of the lens 28 and how it is offset from the optical axis 34 of the fiber when viewed from the top. The optical axis 34 is essentially the center of the core 24 of the fiber 14. The center of the radius is offset about 2 microns from the optical axis of the core in a particular embodiment for a particular single-mode fiber. Other types of fibers might have different offsets. Thus, the center of the curved surface of the fiber end is also offset from the optical axis of the fiber, as viewed from the top. For purposes of discussion, this type of lens is called an offset biconic lens.

Figure 2D:
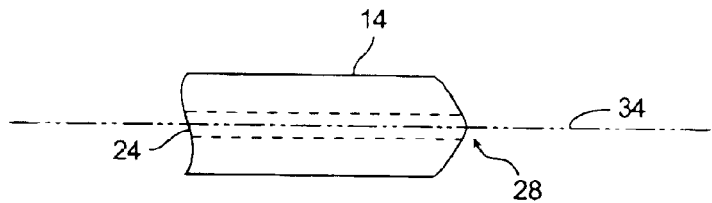
FIG. 2D is a simplified side view of the lensed fiber illustrated in FIG. 2C showing the core of the optical fiber centered with respect to the curve of the lens.

When aligning a fiber with an offset biconic lens to the output of a laser diode, the center axis of the fiber core can be aligned with the axis of the laser diode, without having to angle the fiber with respect to the laser diode output to avoid back reflections. In another embodiment, the laser diode is angled with respect to the center axis of the fiber, by about 2–15 degrees or about 2–5 degrees, which can improve coupling and further reduce back reflections. FIG. 2D is a simplified side view of the lensed fiber illustrated in FIG. 2C showing that the curve of the lens 28 is essentially centered with respect to the core 24 and center line 34 of the optical fiber 14 in this view, i.e. the center of curvature for the biconic lens in this section lies on the centerline 34.

Figure 3A:
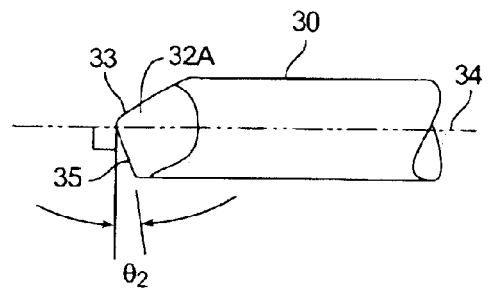
FIG. 3A is a plan view of an angled chisel or wedged shaped lensed fiber end where a side portion of the lens is cut away for angular positioning relative to the laser diode chip front facet.
Figure 3B:
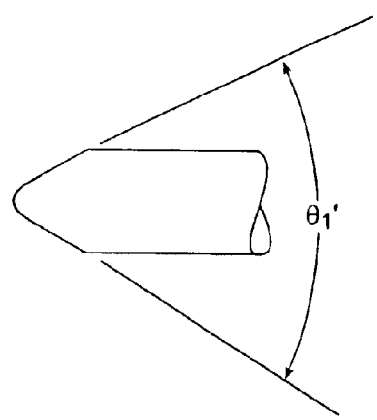
FIG. 3B is a side view of the angled wedged-shape lensed fiber end shown in FIG. 3A.
Figure 3C:
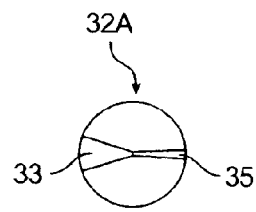
FIG. 3C is an input end view of the angled wedged-shape lensed fiber end shown in FIG. 3A.

Another embodiment of an angled chisel lens is shown in FIGS. 3A–3C. In FIG. 3A, angled chisel lens 32A has an angled lens tip 35 such as around 8° from the normal to the longitudinal or optical axis of the fiber input end 30. The radius of curvature of lens tip 35 may be about 8 μm with a tapered angle Θ1' in the range of about 50° to 55°. Also, a part of the lens is shaved away at 33 so as to allow close positioning of the lens tip to laser diode 16, such as shown in FIG. 5. The distance between laser diode 16 and lensed fiber 14 is very small, such as, for example 10 μm. By angularly shaving off the lens at 33, the lens 32A can be positioned very close at an angle relative to laser diode facet 17 without contact of the facet by the lens. FIG. 3C is an end view of the lens 32A showing the lens tip 35 and the shaved portion 33, in addition to the faces of the lens.

Figure 4A:
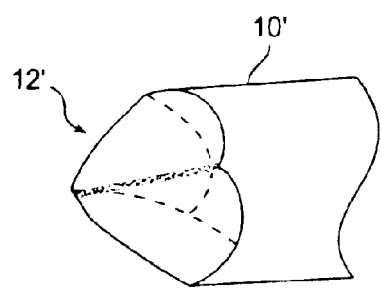
FIG. 4A is a perspective view of a biconic lensed fiber according to another embodiment of the present invention.
Figure 4B:
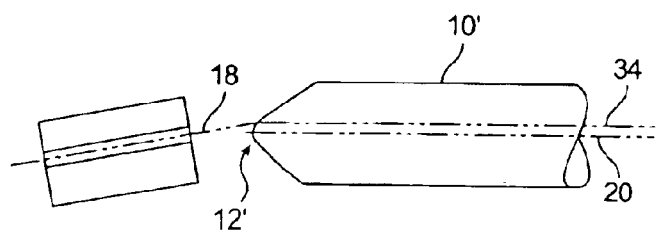
FIG. 4B is a plan view of a biconic lensed fiber in relation to a laser diode.
Figure 4C:
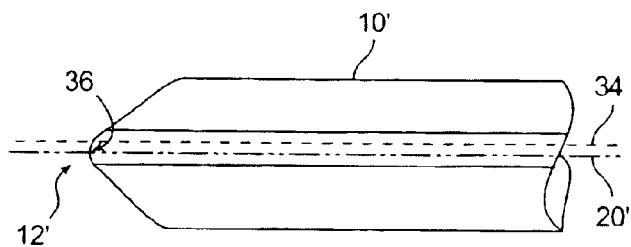
FIG. 4C is a side view of an enlarged portion of the biconic lensed fiber end shown in FIG. 4B.

FIG. 4A is a simplified perspective view of an offset biconic lens 12' on a fiber end 10' according to another embodiment of the present invention. FIGS. 4B and 4C illustrate that the biconic lens 12' has been formed so that the center of curvature 36 of the lens lies on a line 20' offset from the center 34 of the core of the fiber. In one embodiment, the origin is offset from the center of the fiber by about ¼–⅔ of the core diameter. In a particular embodiment, the origin is offset about 2 microns from the center axis of the fiber.

FIG. 4B is a plan view illustrating that the axis 18 of laser diode is nominally aligned to intersect the center 34 of the core of the fiber at the fiber end, with the axis of the laser diode being at a slight angle from the center axis of the fiber. In a particular embodiment, the angle between the axis of the laser source cavity and the center of the core is between about 2–6 degrees. The drawing is not to scale in order to illustrate the fiber end more clearly. The center of curvature 36 of the lens 12' lies along a line 20' offset from the center of the fiber core 34. FIG. 4C is a top view of the fiber end 10' and the biconic lens 12' illustrating the offset of the center of the lens' surface from the center axis 20' of the core of the fiber. In a particular embodiment, the curvature in the top view elevation axis is picked to match the divergence of the light coming out of the laser. This lens is an anamorphic lens, i.e. it provides different powers at different axis of the lens.

Figure 4D:
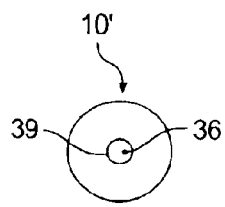
FIG. 4D is an end view of the biconic lensed fiber end of FIG. 4A illustrating an offset in the center of curvature of the biconic lens from the optical axis of the fiber.

FIG. 4D is an end view of the fiber end 10' illustrating the core of the fiber with a circle 39, and the center of curvature 36 of the biconic lens. In a particular embodiment, the core has a diameter of about 6 microns and the center of curvature of the biconic lens is offset from the center of the core about 2 microns with a 15 micron radius for the slow arc and an 8 micron radius for the fast arc. Other dimensions might be appropriate for other types of fibers. Generally speaking, offsets in the range of ⅓ to ⅔ of the mode field diameter are preferred. Offsetting can be done in the slow axis, if desired.

Figure 5A:
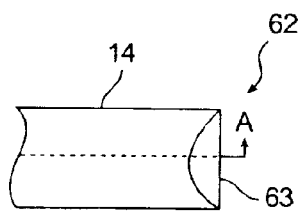
FIG. 5A is a simplified top view of a lensed optical fiber according to an embodiment of the present invention.
Figure 5B:
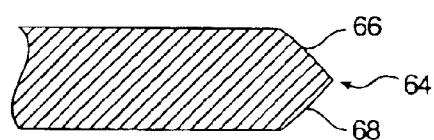
FIG. 5B is a simplified cross section of the lensed optical fiber of FIG. 5A illustrating a pointed chisel lens.

FIG. 5A is a simplified top view of another lens 62 on a fiber end that provides high coupling efficiency and low feedback when used to couple light from a laser diode. This lens 62 is a chisel lens that is nominally symmetrical about the optical axis (i.e. center of the core) of the optical fiber 14 and has an edge 63 that comes to a point. FIG. 5B is a section along A of the lens illustrated in FIG. 5A. The edge of the lens comes to a point 64 that is fabricated by lapping the fiber end at a radius offset from the center axis of the fiber on each side 66, 68 of the chisel lens. Although the edge of the chisel lens is shown as a straight segment in FIG. 2A, the edge could be curved, angled, or sharpened, as discussed above in relation to FIGS. 3A–3C and below in relation to FIGS. 5F–5H, FIGS. 5J–5L, and FIGS. 5N–5R.

Figure 5C:
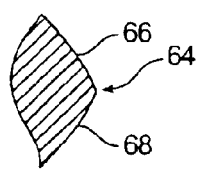
FIG. 5C is an enlarged portion of the cross section illustrated in FIG. 5B.

FIG. 5C is an enlarged view of the point 64. Lapping at offset radii avoids the formation of a "flat" spot at the end of the fiber. Although lapping on a radius that lies along the center axis, as is conventionally done, produces a lensed fiber end with a very small radius of curvature, even such a small curvature can provide a surface that looks relatively flat to a light beam. This flatish surface can reflect light back into a laser diode, for example, while the point produced according to this embodiment provides much less reflection, even though the end of the lensed fiber is not a perfect point, that is to say, some softening of the point typically occurs due to the fabrication techniques. Other fabrication techniques, such as laser ablation or diamond turning, might be used to fabricate a pointed chisel lens.

Figure 5D:
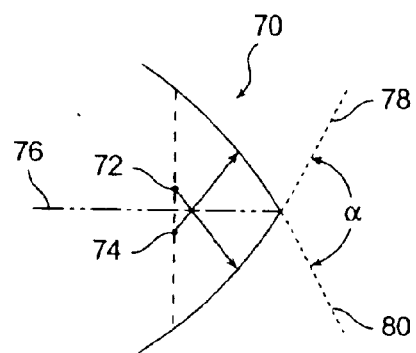
FIG. 5D is a diagram illustrating a pointed chisel lens with doubly offset radii.

FIG. 5D is a simplified diagram illustrating the configuration of a pointed chisel lens 70. The centers of curvature 72, 74 are each offset from the centerline 76. Alternatively, only one center of curvature is offset from the centerline. The tangent lines 78, 80 form an angle α of between about 176–156 degrees, which is exaggerated in this view for purposes of illustration.

Figure 5E:
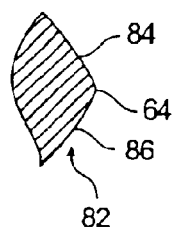
FIG. 5E is a simplified cross section of a pointed chisel lens with two different radii.

FIG. 5E is a simplified cross section of a pointed chisel lens 82 with offset lapping radii of different lengths. This produces lens surfaces 84, 86 with different curves, but the lens still comes to a point 64'.

Figure 5F:
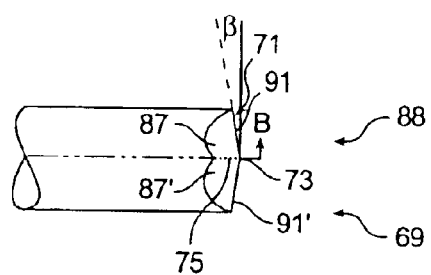
FIG. 5F is a simplified top view of a lensed optical fiber with a double chisel lens, according to another embodiment of the present invention.

FIG. 5F is a simplified top view of a double chisel lens 88. The term "double chisel" means that there are two angled chisel structures 69, 71 formed on the fiber end. Both chisel structures are angled with respect to a plane orthogonal to the center axis of the fiber and intersect to form a point 73. While the lens edge of the pointed chisel lens illustrated in FIG. 5A is pointed, the end of the double chisel lens comes to a "sharpened" point. In an alternate embodiment, one chisel is not angled and the other is. The point is preferably within or very near the core, and may be offset from the center of the core. The double chisel structure provides improved alignment tolerance because the cutaway portions of the fiber end avoid mechanical interference with the front facet of the source. The terms "vertical" and "horizontal" are used for purposes of convenient discussion only and generally relate to the orientation of the fiber when mounted to a substrate, with the major plane of the substrate being essentially parallel to the horizontal axis. Other terms, such as "slow" and "fast" axis are also often used to describe the relative orientations.

The angle β between a plane orthogonal to and the lens edge 91 formed by the chisel faces (see FIG. 5G, ref. nums. 87, 89) of the chisel structure 71. Having an angle greater than 2 degrees provides good feedback suppression, which an angle less than 12 degrees maintains good optical coupling to a laser diode.

It is believed that the point 73 formed by the intersection of the two chisel structures 69, 71 provides some additional lensing action while reducing the flat area that might reflect light back into the source. The lens edges 91, 91', typically have a radius of 5–11 microns in a single-mode silica-based fiber, but could have a lesser or greater radius. In one embodiment, the radius of the first lens edge 91 is essentially the same as the radius of the second lens edge 91'. In another embodiment these radii are different.

The chisel faces 87, 89 of the first chisel structure 71 intersect the corresponding faces 87', 89' of the second chisel structure 69 to form the vertical ridge 75. In a particular embodiment, the vertical ridge comes to a relatively sharp edge, typically with a radius of about 2 microns or less, but could be intentionally or incidentally rounded with a greater radius. The vertical ridges 75, 75' form a sharpened point 73 with the lens edges 91, 91'.

Figure 5G:
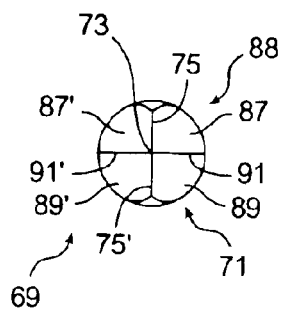
FIG. 5G is a simplified end view of the lensed optical fiber shown in FIG. 5F.
Figure 5H:
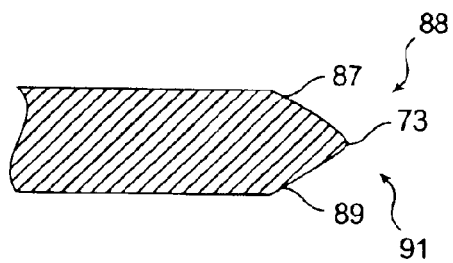
FIG. 5H is a simplified cross section of the lensed optical fiber shown in FIG. 5F.

FIG. 5G is an end view of the double-chisel lensed fiber end 88 shown in FIG. 5E showing the lens edge 91 formed by the chisel faces 87, 89 of the first chisel structure 71 and the vertical ridges 75, 75' forming the point 73. FIG. 5H is a section taken along the section line B showing the radiused nature of the lens edge 91 formed by chisel faces 87, 89 at the point 73 when viewed from this orientation. A section of the second lens edge (see ref. num. 91', FIGS. 5F, 5G) would be similarly radiused. Alternatively, the lens edges could be pointed, in accordance with FIGS. 5A–5E, above.

Figure 5I:
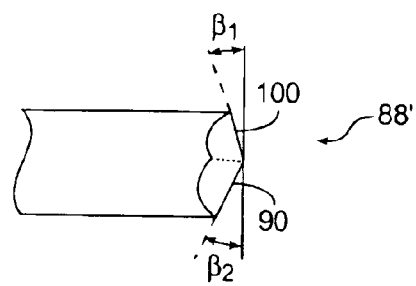
FIG. 5I is a simplified top view of another lensed optical fiber with a double chisel lens having coupling surfaces at two different angles from the center axis of the optical fiber.

FIG. 5I is a top view of an alternative embodiment of a double chisel lens 88' on a fiber end with lens edges 90, 100 each at a different angle $\beta_1$, $\beta_2$ from a plane orthogonal to the center axis of the optical fiber. Both angles are between about 3–12 degrees, and the difference between angles (i.e. $\beta_1-\beta_2$) is between 1–3 degrees. This accommodates misorientation errors when fabricating the laser diode source assembly. For example, the laser diode might be misoriented 2 degrees from its desired orientation to the fiber when the laser diode is attached to the submount. The fiber can then be aligned with first one angle (e.g. $\alpha$) on a side and then the other angle ($\beta$) on the side by rotating the fiber 180 degrees in the assembly tooling. The orientation that provides the best coupling to the laser diode can be selected and the fiber fixed in this position.

Lensed fibers are often mounted at an angle to a laser diode source and in close proximity, about 8–10 microns away from the emitting facet in some cases. As described in the preceding paragraph, one face of the lens can be oriented toward the laser diode for optimized coupling. The other face of the lens serves as cut-away relief so that the fiber end can be mounted close to the laser diode without physical interference between the components.

Figure 5J:
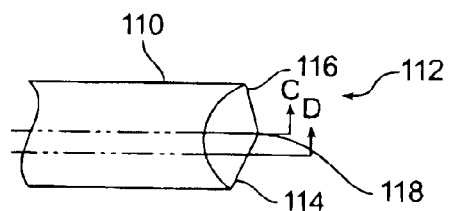
FIG. 5J is a simplified top view of a lensed optical fiber with a pointed chisel lens according to another embodiment of the present invention.
Figure 5K:
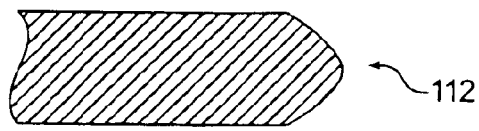
FIG. 5K is a first cross section of the lensed optical fiber shown in FIG. 5J.
Figure 5L:
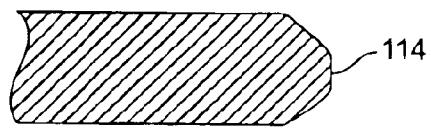
FIG. 5L is a second cross section of the lensed optical fiber shown in FIG. 5J.
Figure 5M:
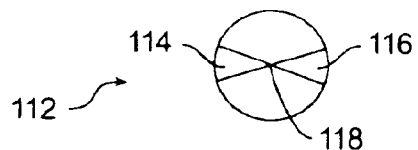
FIG. 5M is a simplified front view of the lensed optical fiber shown in FIG. 5J.

FIG. 5J is a simplified top view of a lensed fiber 110 with another chisel lens 112 according to an embodiment of the present invention. Two section lines, C, D, are illustrated in FIGS. 5K and 5M, respectively. A front view is shown in FIG. 5L. This lens might be easier to fabricate than the similar lenses shown in FIGS. 5F and 5G.

A lensed fiber according to FIG. 5J is made by lapping a conventional chisel lens and then grinding two faces 114, 116 to form a point 118 on the end of the fiber. The cross section of FIG. 5K shows a curved end formed by lapping about a radius along the center line of the fiber, but a pointed end, such as are discussed in relation to FIGS. 5C and 5E could also be fabricated. When mounted in an assembly, one of the faces provides cut-away relief for close assembly to a light source, while the other face forms a lens-like point with the first face to improve optical coupling in the slow direction.

Figure 5N:
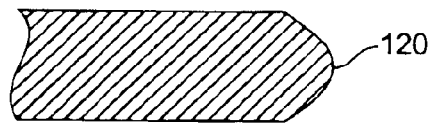
FIG. 5N is a simplified cross section of a doubly lensed optical fiber in the slow direction.
Figure 5O:
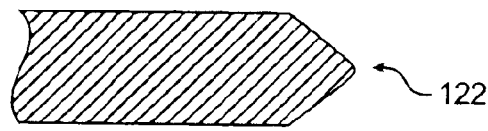
FIG. 5O is a simplified cross section of the doubly lensed optical fiber of FIG. 5N in the fast direction.

FIGS. 5N and 5O are simplified cross sections of a pointed double lensed fiber end illustrating different radii in the fast and slow directions. FIG. 5N represents a cross section of the lens structure for coupling in the slow direction with a radius forming the surface 120 of between about 12–22 microns. The surface of the lens shown in cross section in FIG. 5O comes to a point 122 from a radius of between about 5–11 microns. In a particular embodiment, the radius in the slow direction is about twice the radius in the fast direction. Alternatively, the point can be formed in the cross section of the slow direction (see FIG. 5N). The fast and slow directions generally lie along orthogonal axes, and the doubly lensed fiber end is pointed on at least one of these axes.

Radii can be between about 12–22 microns in the slow direction and between about 5–11 microns in the fast direction, but these dimensions are only examples for an embodiment using a conventional laser diode chip and optical fiber. A suitable value is chosen according to the far-field emission pattern of the light source that the lensed fiber is coupling to and other considerations, such as the index of refraction of the material that the lens is made of and the diameter of the core of the optical fiber, which in one example is about 6 microns.

Figure 5P:
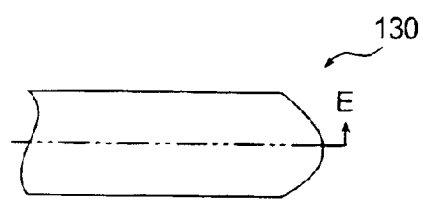
FIG. 5P is a simplified view of a lensed optical fiber with a pointed lens according to another embodiment of the present invention.
Figure 5Q:
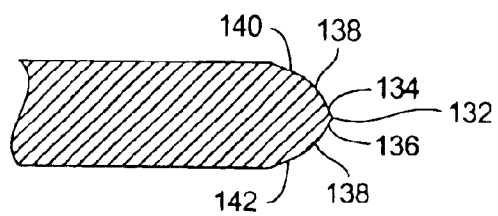
FIG. 5Q is a simplified cross section of the lensed optical fiber shown in FIG. 5P.
Figure 5R:
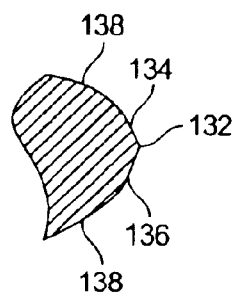
FIG. 5R is an enlarged portion of the cross section shown in FIG. 5Q illustrating facets forming a point on the end of the lensed optical fiber.

FIGS. 5P–5R illustrate another way to make a pointed chisel lens fiber. FIG. 5P is a top view of a lensed fiber 130 according to another embodiment of the present invention. FIG. 5Q is a cross section along section line E and FIG. 5R is an enlarged view of the fiber end illustrating a point 132 formed by cutting facets 134, 136 in the radiused surface 138 of the fiber end. This embodiment of a lensed fiber combines the relatively easy fabrication of a conventional chisel lens with a pointed lens having reduced reflective feedback into the source (laser diode) waveguide. In one fabrication sequence, first facets 140, 142 are ground before lapping the radiused surface 138. Then, the lens is pointed by grinding the second facets 134, 136.

Figure 5S:
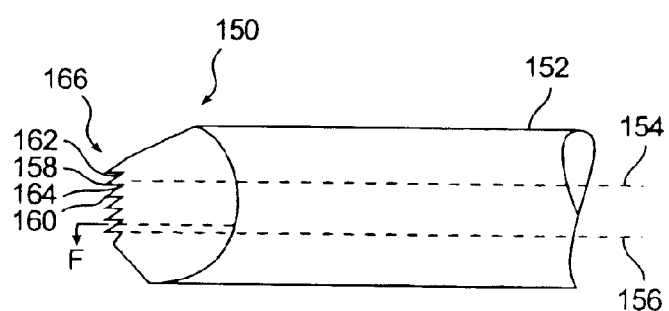
FIG. 5S is a simplified top view of an optical fiber with an integrated Fresnel-type lens.

FIG. 5S is a simplified top view of a Fresnel-type chisel lens 150 on the end of an optical fiber 152. The core of the optical fiber is represented by dotted lines 154, 156. This type of lens avoids the lens tip getting too close to the facet of the laser diode when aligned in a source module. The Fresnel-type lens has a series of ridges 158, 160 and corresponding valleys 162, 164 formed on an edge 166 of the chisel structure. The ridges and valleys are very fine and at a fine pitch, typically much less than the core diameter, and are not drawn to scale, but are enlarged relative to the fiber for purposes of illustration.

The lens structure is "broken" into these ridges and valleys, which for purposes of discussion will be referred to as a "lenslets", rather than angling a chisel lens. This avoids the variation in distance between one side of the lens structure and the other, compared to a conventional angled chisel lens. The ridges and valleys are made using laser ablation or diamond turning techniques. In a further embodiment, both the apexes of the ridges and the troughs of the valleys are radiused, with the radius of the troughs being less than the radius of the apexes. In a particular embodiment the radius of the troughs is about 8 microns and the radius of the apexes is about 7 microns. Generally, the troughs have a radius of about 1.1–1.4 times the apexes. It is generally desirable that the radii of each ridge closer to the facet or source are less than the radii of the troughs, which are further away. In one embodiment, the radii of all ridges are approximately equal and in other embodiments, the radii are different. For example, if the fiber is angled with respect to the light source, then it may be desirable to increase the radii of ridges further from the source.

In an alternative embodiment, a Fresnel lens structure is formed on the face of an optical fiber without lapping the fiber end to form a chisel structure. The Fresnel lens is designed to emulate the optical characteristics of an angled chisel lens.

Figure 5T:
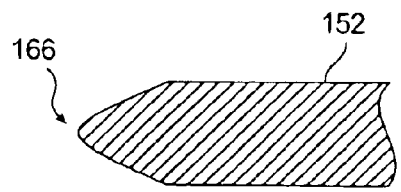
FIG. 5T is a simplified cross section of the lensed fiber shown in FIG. 5S.

FIG. 5T is a simplified cross section of the lens shown in FIG. 5S taken along the section line F showing the radiused edge 166 of the chisel structure on the end of the fiber 152.

Figure 5U:
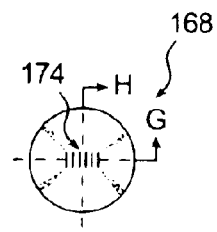
FIG. 5U is a front view of a lensed fiber with a Fresnel-type lens.
Figure 5V:
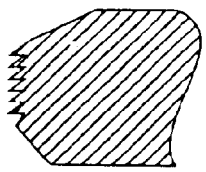
FIG. 5V is a simplified cross section of the lensed fiber of FIG. 5U.
Figure 5W:
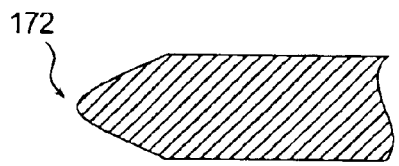
FIG. 5W is another simplified cross section of the lensed fiber of FIG. 5U.

FIG. 5U is a simplified front view of a binary lens 168 according to another embodiment of the present invention. A series of binary lenslets 174 have been formed along the tip of the lens. The shape of the lens is similar to an elongated truncated pyramid. FIG. 5V is a simplified cross section taken along section line G and FIG. 5W is a simplified cross section taken along section line H showing the radiused nature of the tip 172.

Figure 5X:
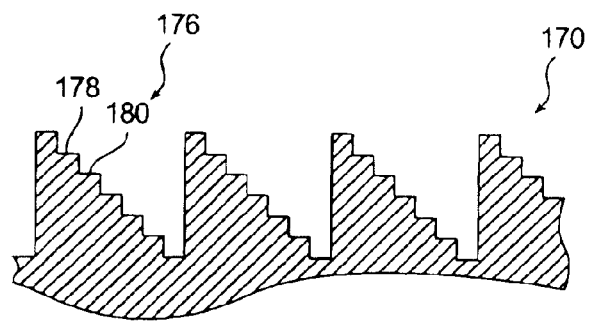
FIG. 5X is a simplified cross section illustrating a binary Fresnel-type optical fiber micro-lens.

FIG. 5X is a simplified cross section of the series of lenslets 170 showing how the lenslets 176 are made up of a series of steps 178, 180. These stepped lenslets operate similarly to the lenslets in the Fresnel-lensed fibers with straight-faced lenslets shown in FIG. 5S. These binary lenslets may provide easier fabrication than the straight-faced lenslet.

Figure 6A:
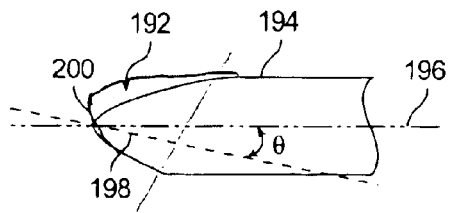
FIG. 6A is a simplified cross section of an angled biconic lens according to another embodiment of the present invention.
Figure 6B:
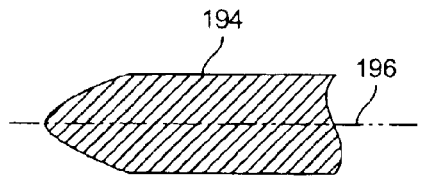
FIG. 6B is a simplified cross section in another plane of the angled biconic lens shown in FIG. 6A.
Figure 6C:
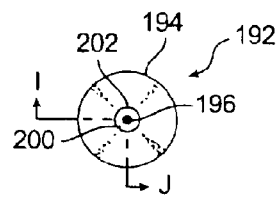
FIG. 6C is a simplified end view of the angled biconic lens shown in FIGS. 6A and 6B.

FIG. 6A is a simplified section of an angled biconic lens 192 on an optical fiber end 194. Hashing lines are omitted in this sectional view for clarity of illustration. Referring to FIG. 6C, this section is taken along section line I. The angled biconic lens 192 is formed at an angle θ from the centerline 196 of the fiber. This gives the lens a somewhat "bent" appearance from this view in relation to the fiber. FIG. 6B is a simplified section of the fiber end 194 taken along section line J (ref. FIG. 6C), showing that the angled biconic lens can have a "straight" orientation in this view, where the tip of the lens in this section is neither angled to or offset from the center axis 196. While the angled biconic lens could be angled on both axes, angling on one axis is desirable to reduce backreflections into a light source, while providing good coupling efficiency.

The angle θ between the center axis of the fiber 196 and the center axis of the lens 198 is generally between about 2–12 degrees. In one embodiment, the center axis of the lens intersects the center axis of the fiber at the tip 200 of the lens, although in other embodiments the tip of the lens might not be on the centerline of the fiber, but it is generally desirable to have the tip within the core portion of the fiber.

FIG. 6C is a simplified front view of the angled biconic lens 192 illustrated in FIGS. 6A and 6B, showing the tip of the lens 200 lying on the center 196 of the fiber end 194. The center of the fiber is generally in the center of the core 202. Comparing FIGS. 6C and 4D, the tip of the offset biconic lens illustrated in FIG. 4D is offset from the center of the core, while the tip of the angled biconic lens illustrated in FIG. 6C is essentially at the center of the fiber. Generally, the center of curvature of the angled biconic lens illustrated in FIG. 6C lies on the line 198, and thus would be offset from the center 196 of the fiber.

A common attribute of certain embodiments of a pointed chisel lens, a double chisel lens, a biconic lens, a Fresnel lens, a binary Fresnel lens, an offset biconic lens, and an angled biconic lens is that they can greatly reduce back reflections into the laser diode source, and thus reduce tracking error in some types of laser modules.

Figure 8B:
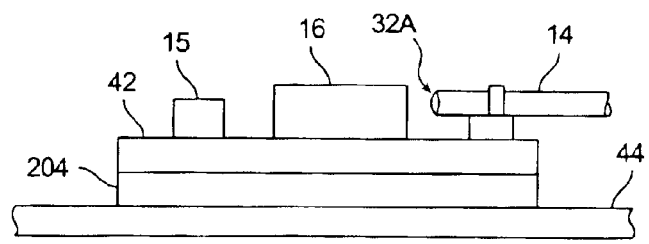
FIG. 8B is a simplified side view of the pump module shown in FIG. 7A.
Figure 8C:
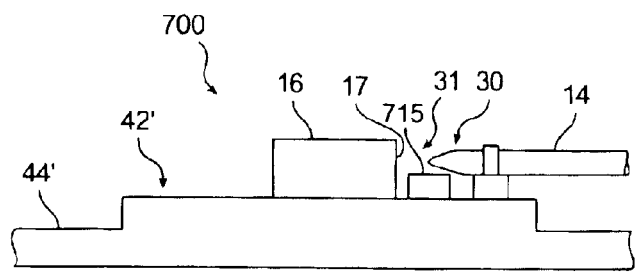
FIG. 8C is a simplified side view of a pump module according to another embodiment of the present invention.
Figure 7:
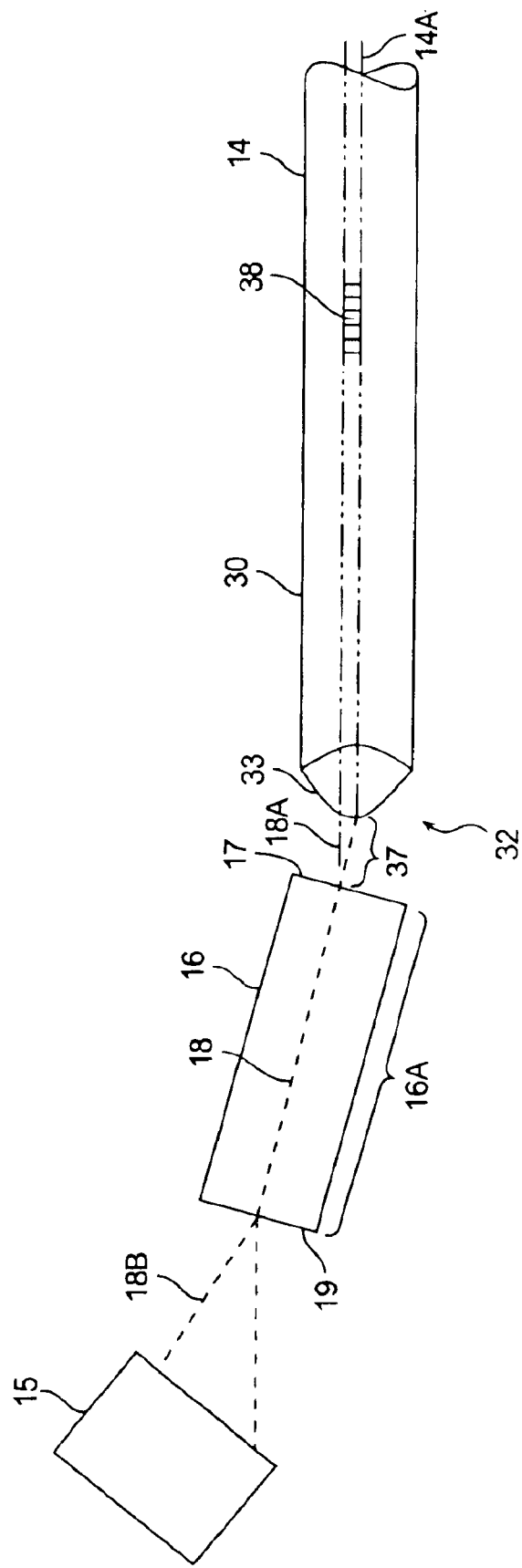
FIG. 7 is a plan view of a pump module arrangement of a light monitor, laser diode and lensed fiber input end with a fiber lens of the type shown in FIG. 7A.
Figure 8A:
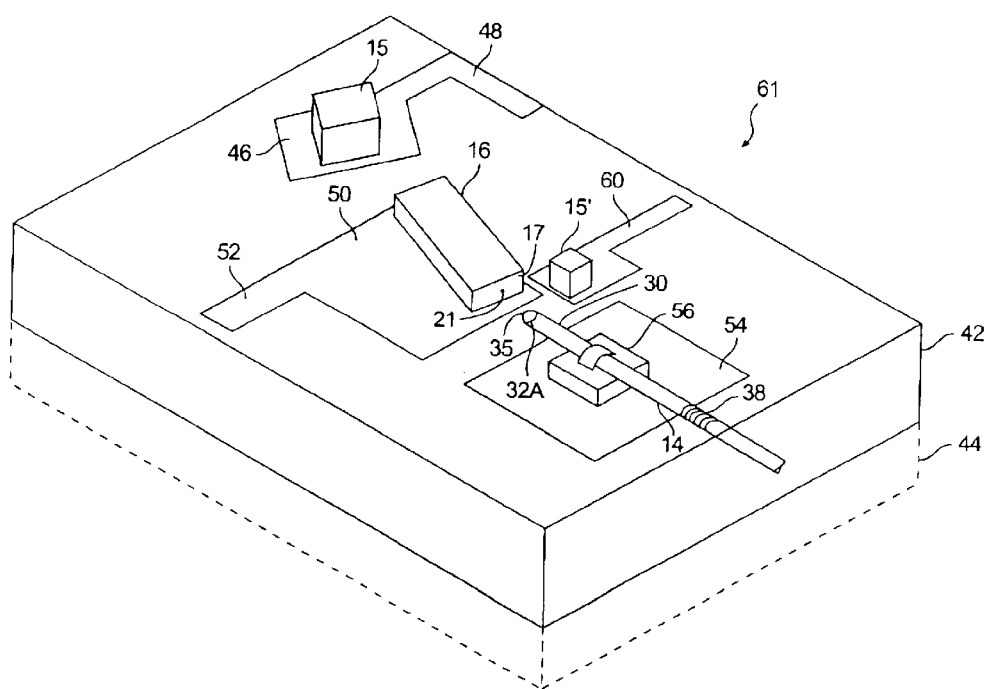
FIG. 8A is a perspective view of a pump module arrangement shown in FIG. 6 on a module platform without the module package.

In FIGS. 7, 8A, 8B, and 8C, several different solutions for suppression of tracking error are illustrated. FIG. 7 is a plan view of a portion of a laser pump module. As previously explained, the surfaces of laser diode front facet 17 and lens 32A have some level of reflectivity despite the use AR coatings on these surfaces so that even with the AR coating a resonance is experienced by light reflected between these surfaces forming a Fabry-Perot secondary cavity 37 in addition to the Fabry-Perot primary cavity 16A of the laser itself. Due to changes in ambient temperature, the length of cavity 37 can change ever so slightly causing the light in this secondary cavity 37 to go into and out of phase with the phase of the light generated in the laser diode 16. A cause of this change in cavity length is flexure or expansion of the platform 42 due to such temperature changes upon which laser monitor 15, laser diode 16, and lensed fiber input end 30 are mounted as shown in FIGS. 8A and 8B. As previously mentioned, changes in the secondary cavity length can have a significant effect on the laser monitor 15 because the net feedback going back into laser diode 16 from the secondary F-P cavity 37, which also varies in amount over time due to changes in the length of the secondary cavity 37, is amplified in the laser diode 16 and the amplified output is detected by the laser monitor 15. Thus, the laser monitor 15 detects a value that is not truly representative of the output intensity of the laser diode 16. One manner of suppressing the formation of such a secondary F-P cavity 37 is to dispose the axial center of lens 32A at an angle to the optical or cavity axis 18 of laser diode 16 as taught in U.S. Pat. No. 5,940,557. Another way is to offset a biconic lens or other anamorphic lens from the center of the fiber end. Also, the laser monitor 15 is disposed at an angle with respect to back facet 19 of laser diode 16 so that light emission 18B from the back facet 19 of the laser diode 16 is not reflected from the laser monitor 15 back into laser diode 16. The light emission 18A from the front facet 17 of the laser diode 16 also diverges somewhat, but the total divergence of the light illuminating the input end of the fiber is small compared to the divergence of the light illuminating the MPD because the lensed fiber end is placed relatively close to the front facet of the laser diode, compared to the placement of the MPD from the back facet of the laser diode.

A fiber Bragg grating ("FBG") 38 has been formed in the fiber 14 according to methods that are well known in the art, and illustrated by the closely spaced bars drawn across the core 14A of the fiber. This FBG reflects a portion of the light from the laser diode back to the laser diode. The fiber Bragg grating causes said laser diode to operate in the coherence collapse regime. In one embodiment, the reflectivity of the FBG at the wavelength of the laser diode is about 0.3–3%. In another embodiment, The FBG includes two gratings and achieves a reflectivity of greater than 6%. The double gratings in the FBG treat circular polarization light propagating in the package snout such that more light is reflected back into the plane of polarization of the laser diode source.

The "snout" is generally a metal tube or cylinder that extends from an optical module case and provides support for the optical fiber(s) extending from the optical module through the snout. The fiber can be coated with a metal, such as Au—Ni, and soldered in the snout to achieve a hermetic seal. The snout often includes a plastic covering or outer sleeve, which can extend beyond the metal tube portion of the snout to provide some strain relief. As an alternative to soldering the fiber in the snout, a compression fitting can be used to achieve a hermetic seal, which does not require the metal coating as with a soldered seal.

Generally, each fiber coming out of or going into an optical module has its own snout, and the fibers are commonly called "pigtails". The end of such a fiber pigtail can be coupled to an optical fiber network by fusion splicing the fiber pigtail to the end of an optical fiber in the network. Another way of optically coupling a fiber pigtail to another optical fiber is to butt-couple the fibers in a capillary in a ferrule.

In a specific embodiment, the reflectivity of the FBG is greater than the internal cavity reflectivity of the front facet of the laser diode. Each grating includes a periodic variation of the fiber that reflects a portion of the light transmitted from the laser diode through the fiber back to the laser diode. This reflected light is emitted from the fiber end back toward the laser diode and a small portion of the light reflected from the FBG is coupled back into the laser diode, providing feedback at the desired wavelength that can at least partially compensate for feedback from a varying secondary FP cavity. The FBG has a relatively narrow bandwidth, and therefore transmits essentially all of the light that is not at the selected wavelength through the FBG portion of the fiber.

FIG. 8A is a perspective view of a portion of a laser pump module 61. The laser diode 16, laser monitor (e.g. MPD) 15, and input end 30 of the fiber 14 are mounted on a platform 42 that is thicker than housing base 44. The fiber 14 is attached to a fiber mount 56 with solder. A portion of the fiber (not shown) covering the soldered section is coated with a few microns of metal to facilitate soldering. The fiber can also be inside a metal tube, such as a KOVAR™ tube, which facilitates welding. An alternative location for an MPD 15' is also shown in this view. In a particular embodiment, the fiber or sleeved fiber is held in place with a relatively soft material, such as room-temperature vulcanizing ("RTV") adhesive or lead-tin solder, compared to an epoxy or hard solder, for example. Using a soft material to attach the fiber to the fiber mount reduces undesirable effects arising from changes in the package arising from temperature variations.

MPD 15' is located near the coupling region between the front facet 17 of the laser diode 16 and the pigtail fiber end 30, rather than behind the laser diode, as shown by the conventionally placed MPD 15. The aperture 21 or emitter of the laser diode is shown for reference. This MPD 15' is illuminated with light from the front facet 17 of the laser diode 16 and/or light reflected off or emitted from the end 30 of the fiber 14. Locating the MPD near the front, rather than the rear, facet avoids tracking error resulting from amplified back reflections. The relative positions are not shown to scale, as the fiber end is typically very close to the front facet of the laser diode. The MPD is mounted to the side of the coupling region (see FIG. 8C, ref. num. 31), which may be on the order of 10 microns between the source and the end of the fiber. Alternatively, the MPD can be mounted adjacent to the fiber end or the front facet.

If a FBG 38 is included in the fiber 14, light from the laser diode at the selected wavelength is reflected back not only for laser feedback purposes, but some portion of the light reflected from the FBG can be coupled to the MPD 15' for output level monitoring. Thus, while it is generally desirable to transmit light from the laser diode 16 to its point of use, providing a FBG, including an FBG having a reflectivity of greater than 6%, can be useful when monitoring the output level of a laser diode near the coupling region. The MPD 15' can be placed to optimally couple to the light emitted by the source, scattered light, or the light reflected or emitted by the fiber end, or balanced. In particular, the fiber end is usually formed and oriented to avoid backreflections into the source. A side-mounted MPD 15' can advantageously utilize this reflected light to monitor the output of the source.

Similarly, some embodiments provide an AR coating on the biconic lens 32A or other lens formed on the fiber end 30 to reduce reflections that might be coupled back into the laser diode. However, the FP cavity formed between the front facet 17 of the laser diode 16 and the end 30 of the fiber 14 can be reduced if the reflectivity of the fiber end is increased above the reflectivity of the front facet of the laser. If a rear-mounted MPD 15 is used, this enhanced reflectivity can reduce problems arising from phasing between the secondary and the primary FP cavities. If a side-mounted MPD 15' is used, this enhanced reflectivity can provide a light signal for the MPD to monitor.

The laser diode, fiber mount, and MPDs are generally soldered or otherwise attached to metallized pads 46, 50, 54 that allow movement of the associated component on the pad for aligning to the other components. The metallized pads provide secure attachment and, in the case of active components, also provide bonding pads 48, 52, 60 for wire bonding or otherwise making an electrical connection to the device. A grounding pad or pads may also be provided on the platform for convenient connection of the electro-optical devices.

FIG. 8B is a simplified side view of the platform 42 on the housing base 44. A thermoelectric cooler ("TEC") 204 is optionally placed between the platform 42 and the housing base. The platform can be of the same material as the housing base, or of a different material. The platform is shown in this figure as being mounted on the TEC, but the platform can be mounted directly to the housing base, or the platform and housing base could be integrated. The platform is preferably made of a material that is stiff compared to the material of the housing base. Such materials include silicon, silicon carbide, aluminum nitride, ceramic, such as alumina-based ceramics, sapphire, and diamond. In an alternative embodiment, the platform is thicker than housing base. In a particular embodiment, the platform is twice as thick as the housing base, and is 1.5 mm thick Choosing a relatively stiff material for the platform, or making the platform thicker than the housing base, stiffens the laser pump module between the fiber end and the laser diode, thus decreasing changes in the secondary cavity length from thermal stresses arising from other areas of the laser pump module, such as the interaction of other portions of the housing base with the module cover, or can.

FIG. 8C is a simplified side view of a portion of an optical assembly 700 according to another embodiment of the present invention. An MPD 715 is mounted "under" the coupling region 31 between the front facet 17 of the laser diode source 16 and the end 30 of the fiber 14. This mounting is a variation of the "side" mounting discussed in relation to the MPD 15' in FIG. 8A but is oriented to couple to light along a different axis. In this orientation, the MPD 715 can take advantage of the wider dispersion of light from the aperture 21, which is typically rectangular with the long dimension lying in the horizontal plane. Some dispersion also occurs to the sides of the aperture, as discussed above in relation to FIG. 8A, but the relatively thin and wide waveguide structure of the laser diode source makes it particularly desirable to place the MPD above or below or above the aperture because of the available light. The optical components are mounted on a substrate 44, with an integrated platform 42' to provide additional stiffness in this region; however, the location of the MPD near the coupling region 31 avoids tracking error arising from amplified back reflections being emitted from the rear facet of the laser diode source. Therefore, other embodiment might dispense with the platform.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A laser package comprising:
   a laser diode source having a first Fabry-Perot cavity having a first cavity axis between a back facet and a front facet, the back facet having a first reflectance and the front facet having a second reflectance, the first reflectance being greater than the second reflectance, for providing a first light output for an optical application;
   a light monitor positioned adjacent to the back facet and aligned to receive a second light output from the back facet of the laser diode source;

a pigtail fiber having a lensed fiber input end and positioned from the front facet of the laser diode source to form an optical coupling region and aligned relative to a lasing cavity of the laser diode source to receive the first light output into the fiber, the first light output exiting the package for coupling to the application, wherein said lensed fiber input end comprises a biconic lens, wherein the biconic lens has two radii of curvature that are of substantially different lengths; and a first portion of the first light output from the lasing cavity reflected off the lensed fiber input end with a second portion directed back into the lasing cavity and a third portion reflected off of the laser diode front facet said front facet forming with the leased fiber input end a second Fabry-Perot cavity generating light that is periodically in and out of phase with the light generated in the first Fabry-Perot cavity due to changes in the length of the second Fabry-Perot cavity caused by package ambient temperature changes so that a tracking error is generated in a signal developed by the light monitor, the biconic lens suppressing the formation of the second Fabry-Perot cavity.

2. The laser package of claim 1 wherein said biconic lens comprises an offset biconic lens having an origin of a first radius of a lens surface offset from a longitudinal center axis of the pigtail fiber at the lensed fiber input end.

3. The laser package of claim 2 wherein a center of a core of the pigtail fiber is co-planar with the first cavity axis of the laser diode source.

4. The laser package of claim 2 wherein a center of a core of said pigtail fiber at the lensed fiber input end is at an angle of about 2–6 degrees relative to the first cavity axis of the laser diode source.

5. The laser package of claim 2 wherein the origin is offset between 1/3–2/3 of a mode field diameter.

6. The laser package of claim 2 wherein the pigtail fiber has a core with a core diameter and the origin is offset 1/4 to 2/3 of the core diameter.

7. The laser package of claim 2 wherein the origin is offset from the longitudinal center axis by about 2 microns.

8. The laser package of claim 1 further comprising a reflective coating provided on a surface of said lensed fiber input end having a third reflectance, the third reflectance being greater than the second reflectance of said front facet of said laser diode source.

9. A laser source module comprising:
a laser diode having a front facet; and
an optical fiber with a center axis and having
a lensed fiber end having a biconic lens with a center of curvature offset from the center axis of the optical fiber, said leased fiber positioned from the front facet of the laser diode to form an optical coupling region and aligned relative to a lasing cavity of the laser diode to receive a first light output into the fiber, wherein the biconic lens has two radii of curvature that are of substantially different lengths.

10. The laser source module of claim 9 wherein the center of curvature is offset from the center axis by about 2 microns.

11. The laser source module of claim 9 wherein the optical fiber has a fiber core with a fiber core diameter and the center of curvature is offset from the center axis by about one third to one half the fiber core diameter.

12. The laser source module of claim 9 wherein the center of curvature is offset from the center axis by about 1/3–2/3 of a mode field diameter.

13. The laser source module of claim 9 wherein the laser diode has an optical axis and the optical axis of the laser diode forms an angle of between about 0–6 degrees with the center axis of the optical fiber.

14. The laser source module of claim 13 wherein the center axis of the optical fiber is co-planar with the optical axis of the laser diode.

15. The laser source module of claim 13 wherein the optical axis of the laser diode is parallel to the center axis of the optical fiber.

16. The laser source module of claim 13 wherein the optical axis of the laser diode is co-linear with the center axis of the optical fiber.

17. A laser source module comprising:
a laser diode having a front facet; and
an optical fiber with a center axis and having
a lensed fiber end having an angled biconic lens with a first lens axis angled to the center axis at an angle of between about 2–12 degrees, said lensed fiber positioned from the front facet of the laser diode to form an optical coupling region and aligned relative to a lasing cavity of the laser diode to receive a first light output into the fiber.

18. The laser source module of claim 17 wherein in the angled biconic lens has a lens tip lying on the center axis.

* * * * *

UNITED STATES PATENT AND TRADEMARK OFFICE
CERTIFICATE OF CORRECTION

PATENT NO. : 6,792,008 B2
DATED : September 14, 2004
INVENTOR(S) : Wolak et al.

It is certified that error appears in the above-identified patent and that said Letters Patent is hereby corrected as shown below:

Column 1,
Line 11, "Hanision Ransom" should read -- Harrison Ransom --.

Column 7,
Line 32, "Tae 3. Kim" should read -- Tae J. Kim --.
Line 44, "and PiN" should read -- and PIN --.
Line 48, "biconic leased fiber" should read -- biconic lensed fiber --.

Column 17,
Line 14, "the leased fiber" should read -- the lensed fiber --.

Column 18,
Line 4, "said leased fiber" should read -- said lensed fiber --.

Signed and Sealed this

Thirteenth Day of December, 2005

JON W. DUDAS
*Director of the United States Patent and Trademark Office*